(12) United States Patent
Ballantyne et al.

(10) Patent No.: US 7,948,269 B1
(45) Date of Patent: May 24, 2011

(54) SYSTEM AND METHOD FOR OPEN DRAIN/OPEN COLLECTOR STRUCTURES IN AN INTEGRATED CIRCUIT

(75) Inventors: Richard S. Ballantyne, Stittsville (CA); Mark Paluszkiewicz, Schaumburg, IL (US); Henry E. Styles, Menlo Park, CA (US); Ralph D. Wittig, Menlo Park, CA (US)

(73) Assignee: XILINX, Inc., San Jose, CA (US)

( * ) Notice: Subject to any disclaimer, the term of this patent is extended or adjusted under 35 U.S.C. 154(b) by 58 days.

(21) Appl. No.: 12/356,267

(22) Filed: Jan. 20, 2009

(51) Int. Cl.
H03K 19/00 (2006.01)
H03K 19/02 (2006.01)

(52) U.S. Cl. .......................... 326/56; 326/86

(58) Field of Classification Search ............ 326/56, 326/86, 83, 87, 112, 115; 327/108, 109
See application file for complete search history.

(56) References Cited

U.S. PATENT DOCUMENTS

| | | | |
|---|---|---|---|
| 5,023,488 A | 6/1991 | Gunning | |
| 5,210,449 A * | 5/1993 | Nishino et al. | 326/57 |
| 5,210,499 A * | 5/1993 | Walsh | 324/649 |
| 5,436,577 A * | 7/1995 | Lee | 326/58 |
| 5,729,152 A * | 3/1998 | Leung et al. | 326/21 |
| 5,914,616 A | 6/1999 | Young et al. | |
| 6,201,743 B1 * | 3/2001 | Kuroki | 365/194 |
| 6,218,858 B1 | 4/2001 | Menon et al. | |
| 7,714,618 B2 * | 5/2010 | Chen | 326/87 |
| 2002/0145445 A1 * | 10/2002 | Iizuka | 326/56 |
| 2005/0275425 A1 * | 12/2005 | Lee | 326/30 |

OTHER PUBLICATIONS

JEDEC Standard "Gunning Transceiver Logic (GTL) Low-Level, High Speed Interface Standard for Digital Integrated Circuits", JESD8-3A (Revision of JESD8-3, Nov. 1993, JEDEC Solid State Technology Association, May 2007, 10 pages.
Texas Instruments, "GTL/BTL: A Low Swing Solution for High-Speed Digital Logic", Application Report, Advanced System Logic Products, SCEA003A, Mar. 1997, 25 pages.
Intel, "Intel Xeon Processor with 533 MHz Front Side Bus at 2 GHz to 3.20 GHz", Document No. 252135-006, Feb. 2004, 94 pages.
Fairchild Semiconductor, Application Note, "GTLP vs. GTL: A Performance Comparison from a System Perspective", AN-1070, Feb. 1997 revised Dec. 2000, 8 pages, www.fairchildsemi.com.

* cited by examiner

Primary Examiner — Vibol Tan
Assistant Examiner — Dylan White
(74) Attorney, Agent, or Firm — Benjamin E. Nise; Kevin T. Cuenot

(57) ABSTRACT

In one embodiment, an output driver is disclosed. The output driver has a first driving device (Q1) that has a first terminal coupled to a bus line terminal, and a second driving device (Q2) that has a first terminal coupled to the bus line terminal. The first driving device (Q1) is configured to couple the bus line terminal to a reference voltage when activated by a first control signal, and the second driving device (Q2) is configured to couple the bus line terminal to a first supply voltage (Vcc) when the second driving device (Q2) is activated by a second control signal. The output driver also has a controller configured to activate the second control signal after the first control signal is deactivated. The second control signal remains active for a first fixed period of time.

19 Claims, 8 Drawing Sheets

ΔT1 sets the delay to actively driven high
ΔT2 sets the duration of the active high drive

SYSTEM AND METHOD FOR OPEN DRAIN/OPEN COLLECTOR STRUCTURES IN AN INTEGRATED CIRCUIT

FIELD OF THE INVENTION

The invention relates to integrated circuit devices (ICs). More particularly, the invention relates to a system and method for an open drain/open collector output driver in an IC.

BACKGROUND

The flexibility and programmability of programmable logic devices such as Field Programmable Gate Arrays (FPGAs) and Complex Programmable Logic Devices (CPLDs) have made them suitable for a multitude of applications including digital signal processing blocks, local area network media access controllers, and high speed bus interfaces as examples. As the speed and performance of programmable logic devices increase, these devices have become more suitable for high speed and high performance applications. As operating speeds increase, a number of technical challenges are encountered.

A specific example of a high performance application suitable for programmable logic devices, more particularly FPGAs, is an interface to a data transfer bus such as a front-side bus (FSB). An FSB interfaces a central processing unit (CPU) to the rest of the hardware on a computer such as a chipset containing memory controllers and I/O controllers, as well as other devices and peripherals. Some interface devices and peripherals can be implemented by programmable logic devices such as FPGAs and CPLDs. As the clocking speeds of the FSB increase past 1 GHz, however, high frequency performance of the programmable logic device implementing these high speed functions become more and more critical. In particular, the performance of I/O blocks 115, which are necessary to drive the FSB, needs to maintain high performance standards, as well.

One particular type of FSB architecture is the Intel Front-Side Bus which can operate at speeds of 1066 MHz. The Intel Front-Side Bus is implemented using an open-drain transmission system that requires a 1.2V termination voltage coupled to a bus line through a termination resistor.

One of the difficulties of implementing open-drain transmission systems using programmable logic devices is that FPGA and CPLD output blocks, such as I/O block 115 shown in FIG. 1 are commonly configured to accommodate a variety of output standards. One such FPGA that incorporates multiple standards such as LVCMOS, LVTTL, HSTL, SSTL, GTL, PCI, LVDS, HT, LVPECL, BLVDS, LVDCI and HSLVDC among others is the Xilinx Virtex-4® FPGA and is described on page 8 of the Virtex-4 FPGA Data Sheet: DC and Switching Characteristics, published Jun. 6, 2008, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.) A selection of available programmable I/O standards provides programming and application flexibility. However, in order to accommodate a variety of output standards, circuitry dedicated to each standard, such as driving circuits and pull-up and pull-down resistors, resides within I/O block 115 and may be coupled to an output pad. This extra circuitry creates excess output capacitance on the I/O pad making it more challenging to drive the output pad in high-speed applications such as a 1066 MHz FSB. For example, in open-drain standards such as terminated Gunning Transceiver Logic (GTL), an increase in output capacitance at the driving pin directly affects the rise time of the logic bus, which is based on the RC time constant of the pull-up resistor and bus-capacitance. Given that a typical programmable logic IC may have an output capacitance upwards of about 5× the output capacitance of a custom logic device, a typical programmable logic IC may fail to adequately drive a high-speed open-drain bus.

To accommodate high-speed I/O driving applications in programmable logic IC's, what is needed are circuits and systems of driving high speed outputs while still maintaining flexibility in programming.

SUMMARY

In one embodiment, an output driver is disclosed. The output driver has a first driving device that has a first terminal coupled to a bus line terminal, and a second driving device that has a first terminal coupled to the bus line terminal. The first driving device is configured to couple the bus line terminal to a first supply potential when activated by a first control signal, and the second driving device is configured to couple the bus line to a second supply potential when the second driving device is activated by a second control signal. The output driver also has a controller configured to activate the second control signal after the first control signal is deactivated. The second control signal remains active for a first fixed period of time.

In another embodiment, an output driver for driving a bus line coupled to an external resistor biased at a first voltage is disclosed. The output driver has a first driving device having a first terminal coupled to a first node of a bus line. The first driving device is configured to couple the bus line to a reference voltage when activated by a first control signal. The output driver also has an internal resistor having a first terminal coupled to the first terminal of the first driving device, and a second terminal coupled to a second voltage. The potential difference between the first and second voltages is less than the potential difference between the second voltage and the reference voltage.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
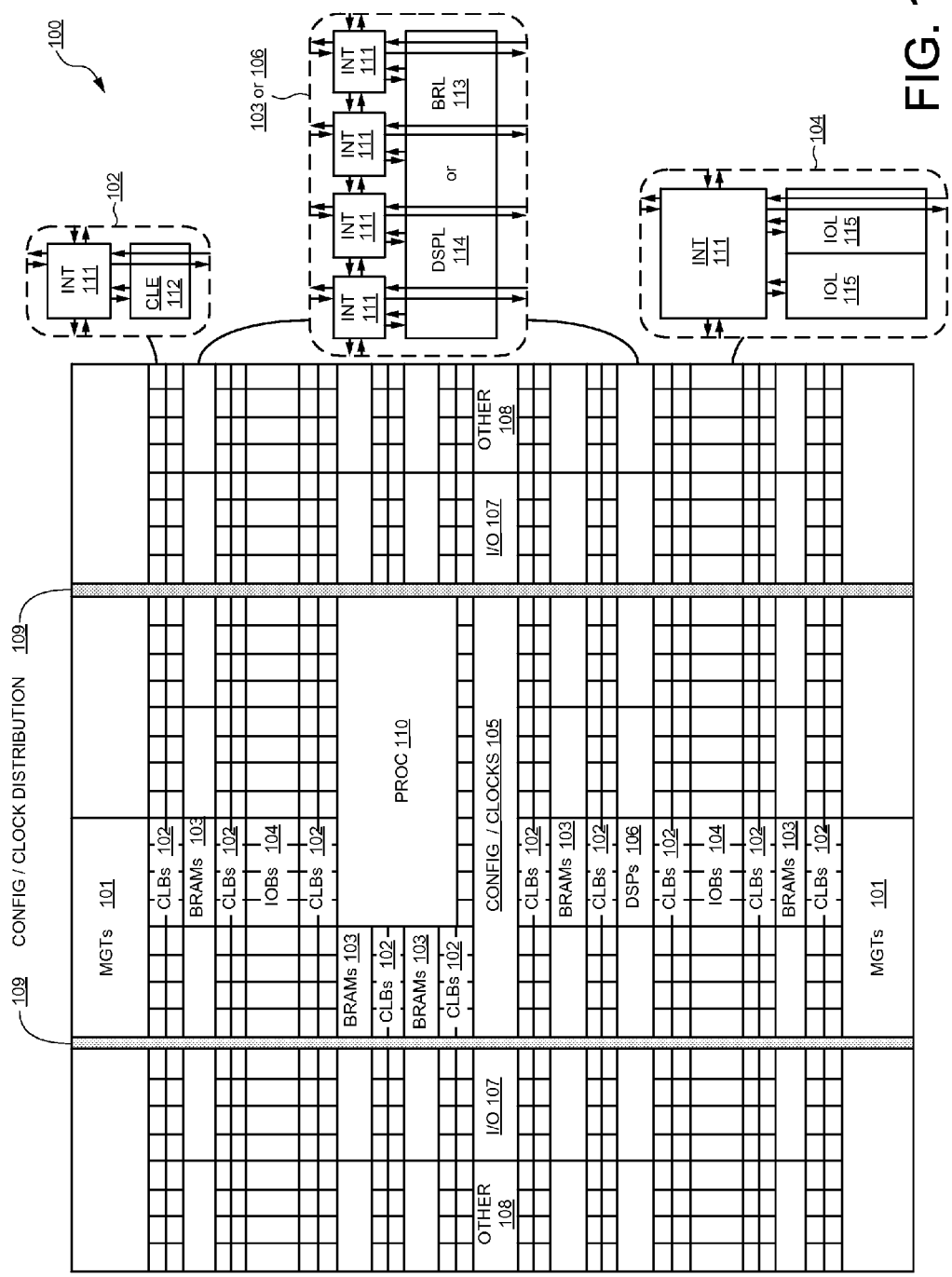
FIG. 1 is a block diagram of an exemplary prior art FPGA.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a system and method of driving open drain and open collector structures in programmable logic devices. Embodiments of this invention may also be applied to other circuits and systems that require the driving of high capacitive loads in high speed circuit applications.

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of the columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2A:
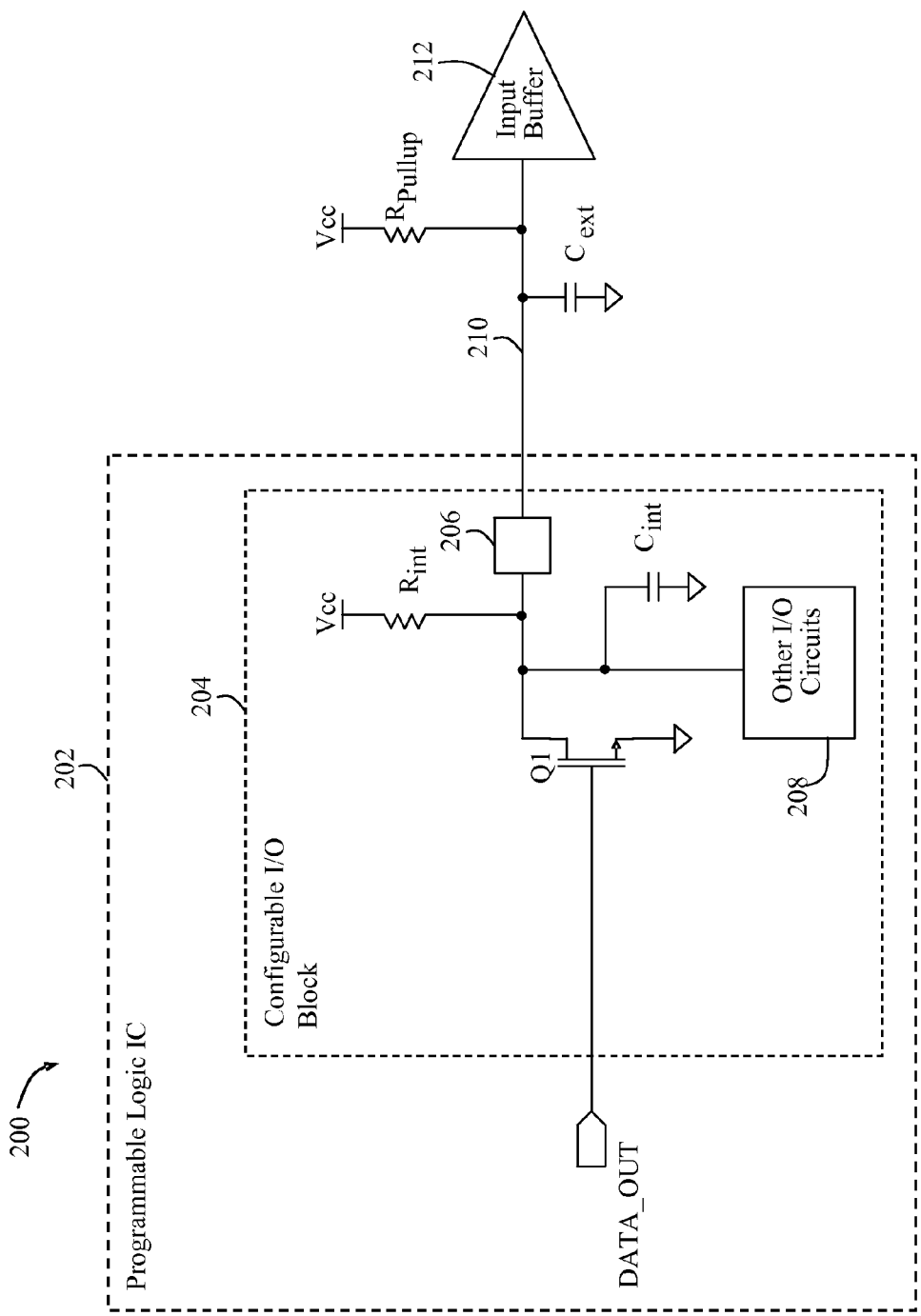
FIG. 2a is a schematic of a prior art open drain driver circuit interfaced with a bus.

A schematic of an open drain bus system 200 according to the prior art is shown in FIG. 2a. Bus system 200 has a programmable IC 202 in which configurable I/O block 204 is configured as an open drain output driver. Bus system 200 can be any kind of bus system that uses an open drain structure, such as an FSB interfaced with a CPU. In the case of an FSB, a known open drain bus standard is GTL, as mentioned hereinabove. Here, programmable IC 202 represents the driver and input buffer 212 represents a receiver coupled to bus line 210. Input buffer 212 is representative of any other device coupled to bus line 210, for example a CPU or other peripheral. Bus system 200 can be a bi-directional bus system.

Programmable IC 202 can be an FPGA, CPLD, or any other type of programmable device, including devices that are partially programmable. Moreover, the techniques described herein may be applied to any device used in a bus system. The output driver has a pull-down transistor Q1 whose gate is coupled to signal DATA_OUT, which represents output data to be driven on bus line 210. The drain of transistor Q1 is coupled to output pad 206, which is coupled to bus line 210. Alternatively, in an open collector bus system, Q1 can be implemented using a Bipolar transistor, in which case, the collector of Q1 is coupled to output pad 206. Bus line 210 typically is a metal trace disposed on a printed circuit board (PCB). The connection from output pad 206 to bus line 210 is made via a package connection, for example a bond wire connected to a lead frame coupled to a package pin. Output pad 206 can also be a bump bond connection, as an example.

Open drain bus system 200 has external pull-up resistor $R_{Pullup}$ coupled between bus line 210 and supply Vcc. Pull-up resistor $R_{Pullup}$ is coupled to a voltage of about 1.2V. In order for a logic "Low" to be asserted on bus line 210, a voltage of less than about 0.77 volts is applied. This is accomplished by turning on transistor Q1, which essentially pulls bus line 210 to ground potential, typically about 0V. For a logic "High" to be asserted on bus line 210, on the other hand, a voltage of greater than about 0.83 volts is applied to bus line 210. In prior art systems, this is typically accomplished by turning off transistor Q1 and allowing pull-up resistor $R_{Pullup}$ to pull bus line 210 up to the Vcc potential of about 1.2V. Some prior art open drain drivers also have an internal pull-up resistor $R_{int}$ coupled to Vcc. Having both an internal and an external pull-up resistor assists with signal integrity by providing a matched impedance environment for bus line 210. The values for pull-up resistors $R_{Pullup}$ and $R_{int}$ are typically between about 40Ω and about 80Ω.

The speed at which bus line 210 makes a logical transition is a function of the RC time constant based on the pull-up or pull-down resistance, and the total capacitance on bus line 210. The total capacitance on bus line is made up of $C_{ext}$ and $C_{int}$, which represent the total external capacitance and total internal capacitance seen on bus line 210, respectively. The total external capacitance $C_{ext}$ seen by bus line 210 is made up of parasitic capacitance between bus line 210 and a PCB ground plane, capacitance between bus line 210 and adjacent bus lines, input capacitance of input buffer 212, and the parasitic capacitance of other I/O devices coupled to bus line 210. The total internal capacitance $C_{int}$ is made up of internal parasitic capacitance coupled to output pad 206, including line capacitance for signal lines coupled to output pad 206, device capacitance of circuit devices coupled to these signals lines, as well as capacitance associated with the pins and package of programmable IC 202.

For devices having configurable I/O blocks that accommodate multiple standards, however, internal device capacitance $C_{int}$ can be dominated by other I/O circuits 208 coupled to output pad 206. These other I/O circuits 208 may include additional output transistors, pull-up and pull-down resistors, output amplifiers, and other circuit devices coupled to the drain (or collector) of transistor Q1. These other I/O circuits 208 are typically disabled, but due to the generally large size of I/O devices, these other I/O circuits 208 may still have a very large parasitic capacitance. For example, a typical dedicated output pad for a custom (non-programmable) IC may be about 1 pF to about 2 pF. For a configurable I/O block, such as block 204, the total output capacitance may be on the order of 10 pF. In some prior art circuits, the total output capacitance may even be upwards of 50 pF.

Given an output capacitance of 10 pF and a pull-up resistance of 50Ω, the RC time constant is 500 ps, which corresponds to a 5 time constant settling time of 2.5 ns. This settling time clearly exceeds the 938 ps symbol time of a 1066 MHz FSB bus.

Figure 7A:
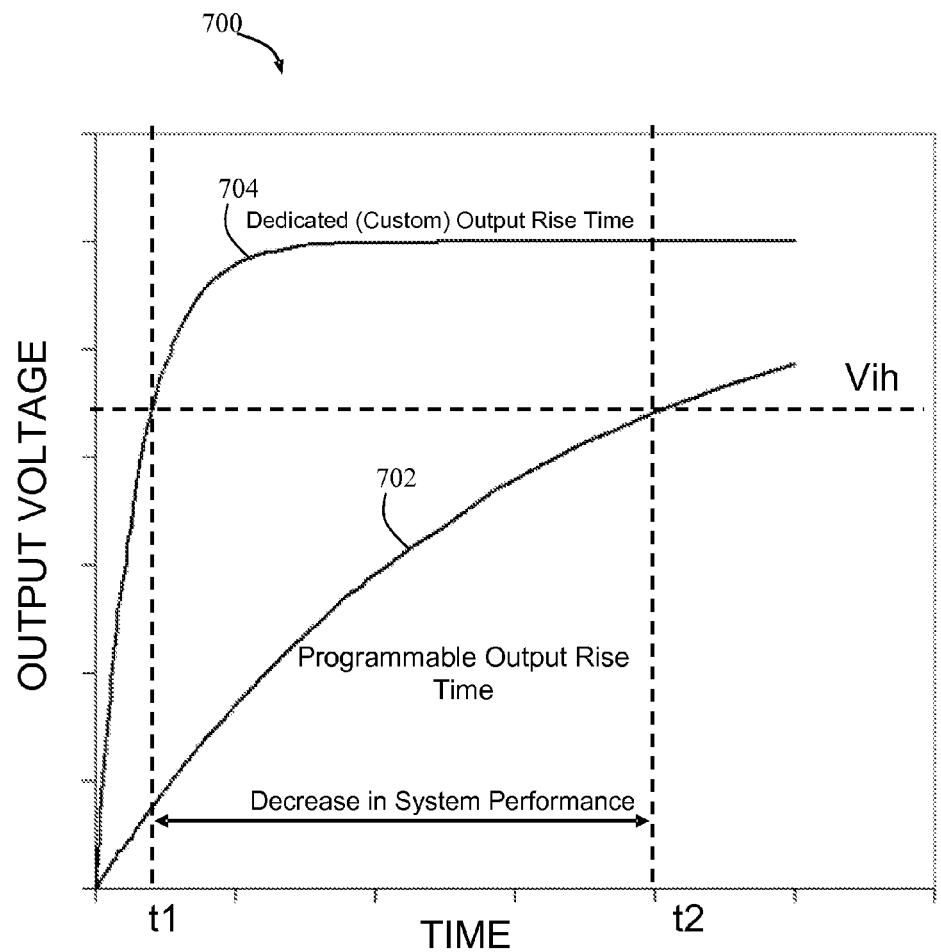
FIG. 7a illustrates waveforms of prior art open drain drivers.

In FIG. 7a, output waveforms 700 representative of the performance of configurable I/O block 204 are shown. Trace 702 represents the voltage of bus line 210 with respect to time for configurable I/O block 204 assuming high capacitive loading due to other I/O circuits 208. Trace 704, on the other hand represents a bus line voltage with respect to time for a dedicated output driver unburdened by additional capacitive loading. Line Vih represents the input "High" logic detection threshold. Input voltages below Vih are detected as a "Low" state, and input voltages greater than Vih are detected as a "High" state. Both traces 702 and 704, therefore, show a logic transition from "Low" to "High." The lower capacitance output, as evidenced by trace 704 reaches voltage Vih first at time t1, while the higher capacitance output, as evidenced by trace 702, reaches Vih last at time t2. The difference in time between time t1 and time t2 graphically illustrates the potential decrease in performance when prior art configurable I/O blocks are used in open drain bus systems instead of custom designed or individually dedicated output drivers.

Figure 2B:
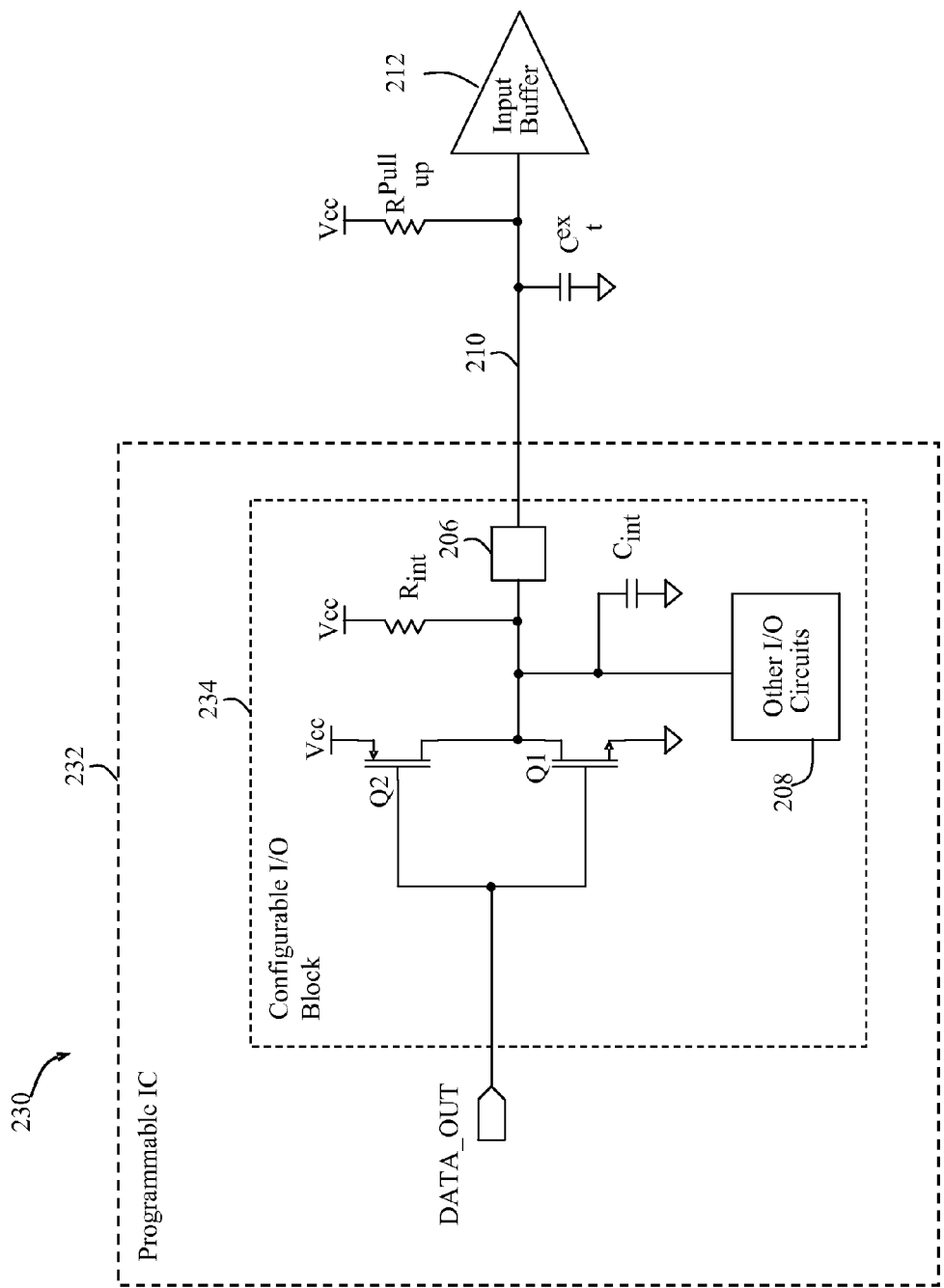
FIG. 2b is a schematic of a prior art totem-pole driver circuit interfaced to a bus.

One prior art solution to the problem of slow rise time in bus systems is the use of a totem-pole driver made up of transistors Q1 and Q2 in bus system 230 shown in FIG. 2b. Rather than relying on pull-up resistors $R_{int}$ and $R_{Pullup}$ to drive bus 210 to a logic "High" state (e.g., 1.2V), bus system 230 uses transistor Q2 to pull bus line 210 to the logic "High" state. Because transistor Q2 can be sized to have a very low output resistance, for example 10Ω or less, the logic "Low" to "High" transition can be made quickly, thereby driving the extra capacitance due to other I/O circuits 208 within configurable I/O block 234. Driving an open drain bus with configurable I/O block 243 configured as a totem-pole driver, however, exposes bus system 230 to the risk of crowbar current and excess power dissipation. For example, if programmable IC 232 is driving bus line 210 to 1.2V while another device or peripheral coupled to bus line 210 is asserting a logic low, a high current will flow from the drain of transistor Q2, onto bus line 210, and through the pull-down device of the other component (not shown) asserting the low-logic level. This crowbar current will dissipate excess power and possibly degrade system performance if the power supplies and the devices conducting the current are unable to maintain nominal performance while continually sourcing a short-circuit current. Power supply disturbances and device latch-up may also occur as a result of crowbar current.

Figure 3:
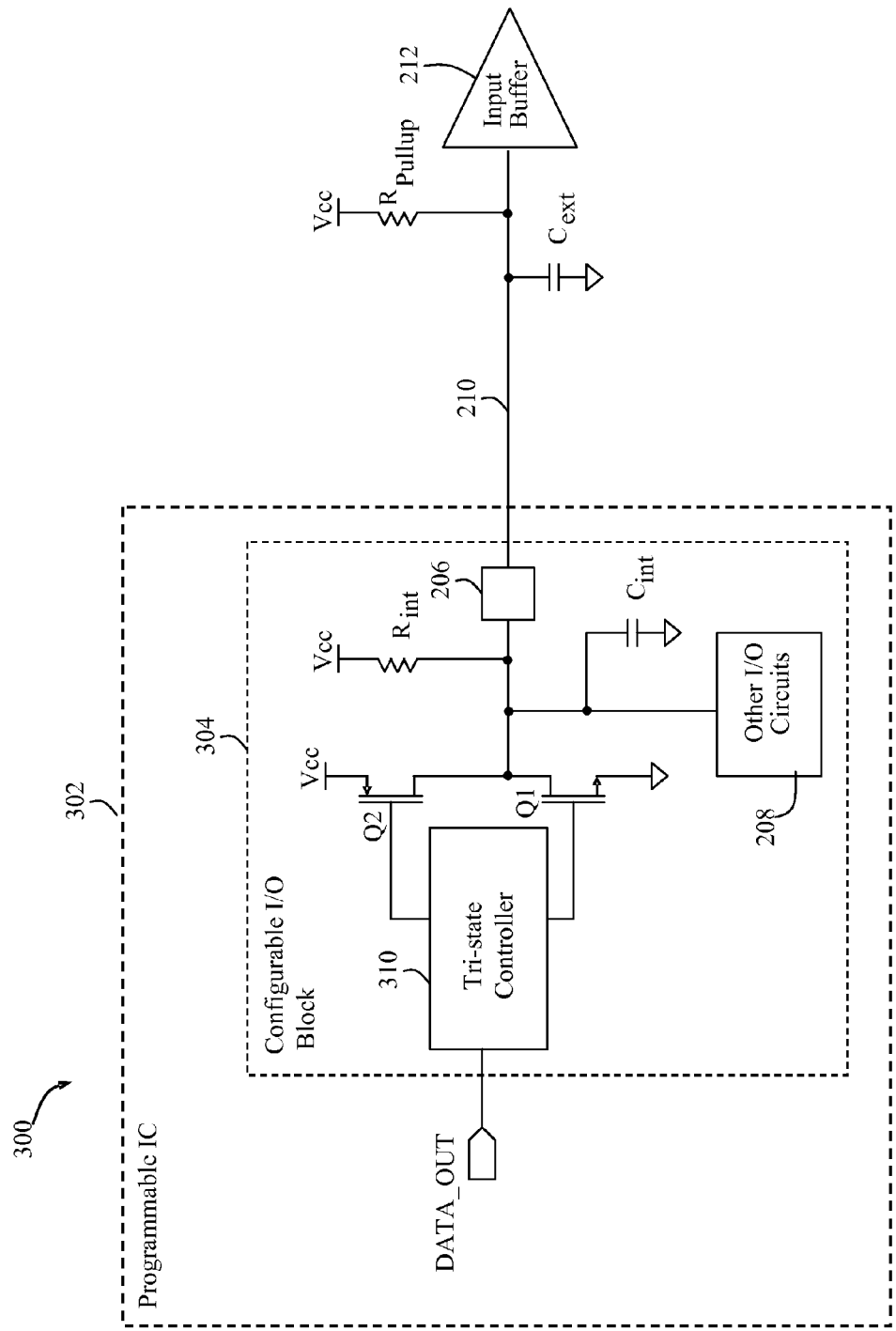
FIG. 3 is a schematic of an open drain driver according to an embodiment of the present invention.

Turning to FIG. 3, bus system 300, according to an embodiment of the present invention, is illustrated. Here a totem-pole output made of transistors Q1 and Q2 is controlled by tri-state controller 310. Tri-state controller 310 controls the gates of transistors Q1 and Q2 so that transistor Q2 is momentarily turned on near the beginning of a transition from logic "Low" to logic "High." By pulsing transistor Q2 on, a fast logic transition is achievable under highly capacitive load conditions. Because transistor Q2 is only active for a short period of time, for example between about 100 ps and about 300 ps for 1066 MHz FSB bus implementations, problems stemming from continuous short-circuit or crowbar current are avoided if both a logic "High" and logic "Low" are simultaneously asserted on bus line 212. While a single output driver is shown driver is shown driving a single bus line 210 for the purpose of simplicity of illustration, it should also be noted that in embodiments of the present invention, multiple instances of embodiment output drivers may reside on a single integrated circuit or in a single bus system to support buses of varying numbers of bits.

In the illustrated embodiment of FIG. 3, Q1 functions as a pull-down device and Q2 functions as a pull-up device. In alternative embodiments, Q1 can be implemented as a pull-up device using, for example, a PMOS device, and Q2 can be implemented as a pull-down device using, for example, an NMOS device, and resistor $R_{int}$ can be implemented as a pull-down resistor. Such an arrangement can be used, for example, in systems having a negative power supply voltage, or in systems configured to actively drive a bus line to a positive power supply voltage. Accordingly, the polarity of the outputs of Tri-state controller 310 would be modified in such an alternative embodiment, for example, by inverting the outputs driving the gates of Q1 and Q2.

Figure 7B:
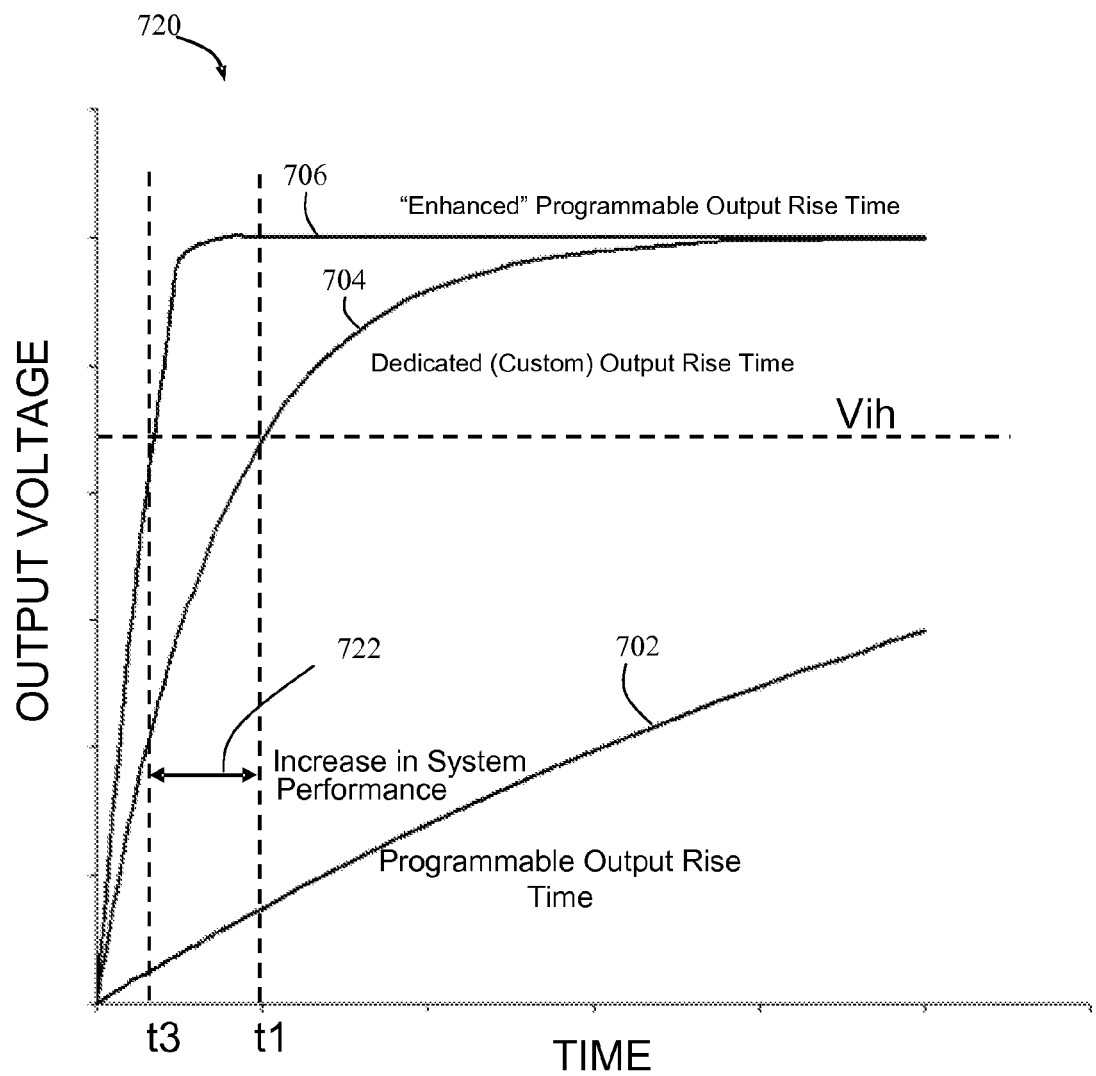
FIG. 7b illustrates waveforms comparing the performance of prior art open drain drivers and an open drain driver according to an embodiment of the present invention.

FIG. 7b illustrates a set of waveforms 720 comparing the performance of prior art embodiments with an embodiment of the present invention. Trace 702 shows the output response of an open drain driver implemented by a configurable I/O block 204 (FIG. 2a). As described hereinabove, the output response of trace 702 is slow because of the high output capacitance of configurable I/O block 204. Trace 704 represents a dedicated open drain driver, and trace 706 illustrates an "enhanced" programmable output with a faster rise time achieved by pulsing a pull-up transistor. The dedicated output rise time as shown in trace 704 reaches the input "High" logic detection threshold Vih at time t1, while the "enhanced" programmable output, according to an embodiment of the present invention, reaches Vih at time t3, which occurs before time t1. The time difference between times t1 and t3 represents a performance improvement 722 over and above a custom logic solution. The actual time difference between times t1 and t3 depends on the pulse time of the pull-up transistor, as well as the supply voltage coupled to the pull-up transistor and pull-up resistors.

In embodiments of the present invention, programmable IC 302 is implemented in a sub-micron CMOS process, where transistor Q1 is an NMOS device and transistor Q2 is a PMOS device. In alternative embodiments of the present invention, however, other processes and device types can be used. Bipolar transistors can be used as driving transistors in a bipolar or a BiCMOS process and MESFETS can be used in a GaAs MESFET process, as well as other devices and processes. In further embodiments of the present invention, transistors Q1 and Q2 may be implemented on a custom application specific IC (ASIC), gate array, or general purpose IC that does not have a programmable structure, as well. In alternative embodiments of the present invention, IC 302 can be a dedicated device that does not contain programmable logic or a dedicated device with a configurable output. In general, embodiments of the present invention may be useful in any system or device within a bus system having open drain/collector style outputs.

Figure 4:
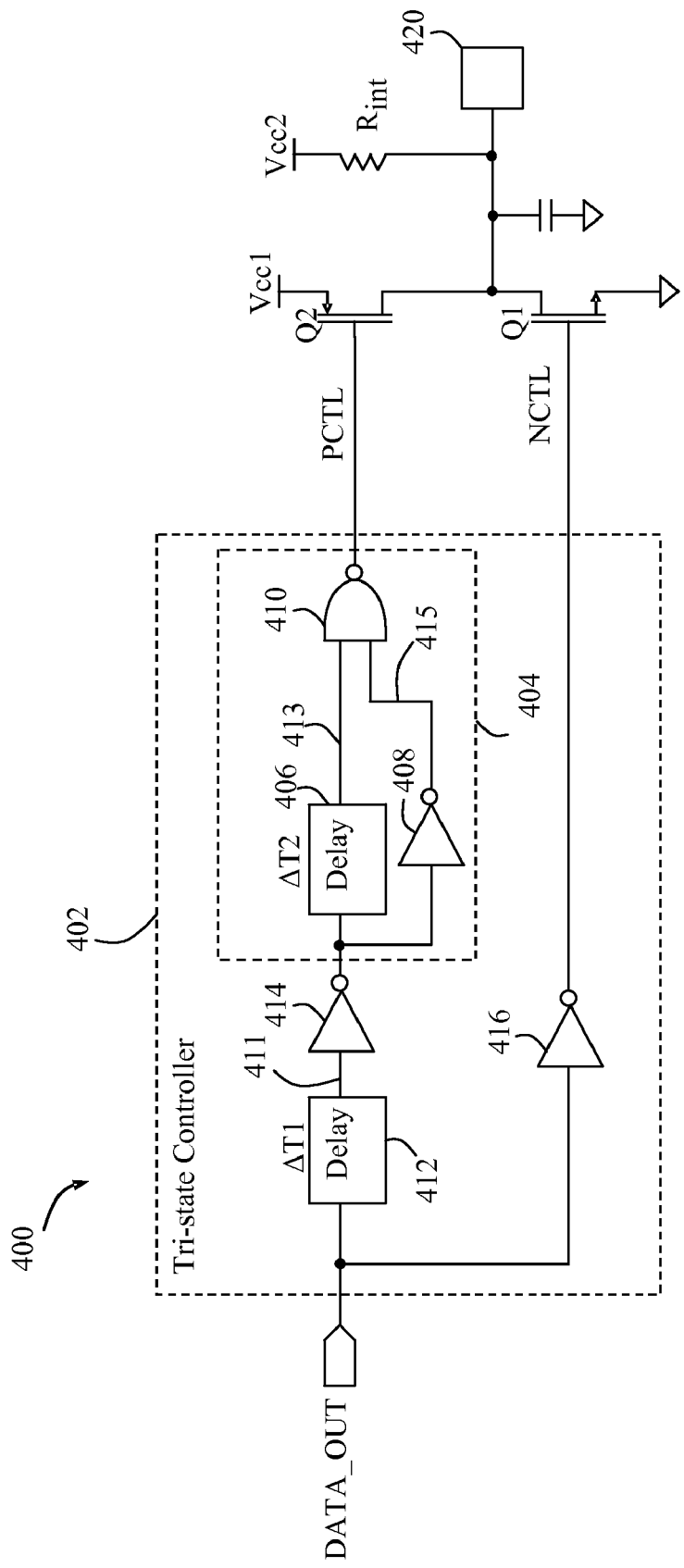
FIG. 4 is a schematic of an open drain driver according to another embodiment of the present invention.

An embodiment driver configuration 400 of a configurable I/O block is shown in FIG. 4. Tri-state controller 402 takes signal DATA_OUT as an input, and produces signals NCTL and PCTL, which drive the gates of transistors Q1 and Q2, respectively. Transistors Q1 and Q2 are coupled to pad 420. Tri-state controller 402 buffers and inverts signal DATA_OUT with inverter 416 to produce signal NCTL. Therefore, transistor Q1 turns on when signal DATA_OUT goes "Low." To produce signal PCTL, signal DATA_OUT is delayed with optional delay 412. Signal 411, the output of delay 412, is buffered by inverter 414 and passed to pulse generator 404, which has delay element 406, inverter 408 and NAND gate 410. When DATA_OUT is at a logic "Low" state, signal 413 at an input to NAND gate 410 is "High" and signal 415 is "Low." PCTL, which is the output of NAND gate 410, is therefore "High," and transistor Q2 (a PMOS device) is shut off. When DATA_OUT transitions from "Low" to "High," signal 415, the output of inverter 408 goes "High," thereby bringing signal PCTL low. After signal 411 propagates though inverter 414 and delay 406, signal 413 transitions from "High" to "Low," thereby bringing PCTL "High" and transistor Q2 is shut off. It can be seen that tri-state controller 402 is configured to generate a low going pulse on PCTL when triggered by a logic "Low" to "High" transition at DATA_OUT. The negative going pulse-width of PCTL is generally about the same as the delay of delay element 406.

Figure 5:
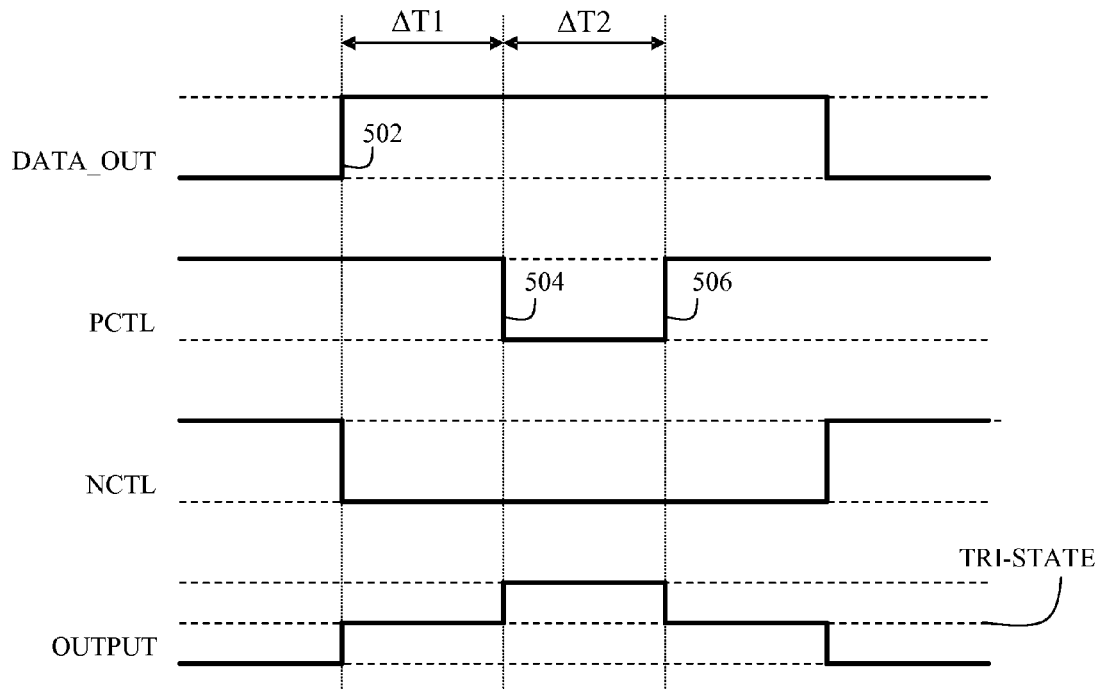
FIG. 5 is an exemplary timing diagram of the operation of an open drain driver according to an embodiment of the present invention.

FIG. 5 shows a timing diagram 500 illustrating the operation of tri-state controller 402 (as shown in FIG. 4). Signal NCTL follows an inverted version of DATA_OUT. For example, when DATA_OUT goes "High," NCTL goes "Low." When DATA_OUT transitions "Low," NCTL transitions "High." PCTL, on the other hand, remains high, unless DATA_OUT transitions from "Low" to "High." PCTL goes "Low" at falling (edge 504) at time ΔT1 after rising edge 502 of DATA_OUT. PCTL then goes high again (edge 506) at time ΔT2 after PCTL goes "Low" (edge 504). Delay time ΔT1 is approximately equivalent to the delay time of delay element 412 in FIG. 4, and delay time ΔT2 is approximately equivalent to the delay time of delay element 406. Signal OUTPUT is a representation of the output seen at pad 420 (FIG. 4). It can be seen that when PCTL is "High" and NCTL is "Low," signal output is at a high-impedance or tri-state as represented by the middle dashed line on signal OUTPUT in FIG. 5.

In embodiments of the present invention, referring again to FIG. 4, the source of transistor Q2 is biased at Vcc1 and internal pull-up resistor $R_{int}$ is biased at Vcc2. The voltage of both Vcc1 and Vcc2 can be optimized to improve system performance. For example, if either Vcc1 or Vcc2 is set to a voltage in excess of Vcc applied to the external pull-up resistor $R_{Pullup}$ (FIG. 3), the apparent rise time of the bus line coupled to output pad 420 will be decreased. In embodiments of the present invention, Vcc1 and Vcc2 are both set to about 1.4V when driving an external bus biased with 1.2V at pull-up resistor $R_{Pullup}$. In other embodiments of the present invention, Vcc1 can be biased at a higher voltage while Vcc2 is biased at a lower voltage, or Vcc2 can be biased at a higher voltage while Vcc1 is biased at a higher voltage. In some embodiments of the present invention, performance can be improved if Vcc2 is set to a higher voltage, for example 1.4V, and Q2 remains off during operation of the driver.

In alternative embodiments of the present invention, tri-state controller 402 may be implemented in a manner different from the circuit shown in FIG. 4. For example, different logical structures may be used to generate PCTL, or the generation of PCTL and NCTL can be based on synchronous logic rather than, or in addition to, using delay elements. For example, clocked delay lines or shift registers can be used. Furthermore, in alternative embodiments of the present invention, PCTL may be operated independently from NCTL. Tri-state controller 402 may also have other inputs such as a tri-state input, which would keep transistors Q1 and Q2 both shut-off when the tri-state input is asserted. Other embodiments of the present invention may even be targeted toward multi-level logic.

Figure 6:
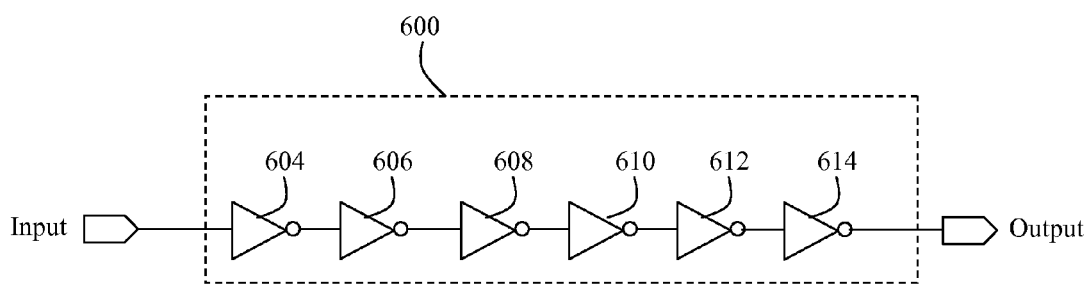
FIG. 6 is a schematic of a delay element according to an embodiment of the present invention.

Turning to FIG. 6, an embodiment delay cell 600 is illustrated, which has a chain of inverters 604, 606, 608, 610, 612 and 614. The time delay of delay cell 600 is dependent on the number of inverter stages in the cell, as well as on how each inverter is sized. Embodiment delay cells may, therefore, contain more or fewer inverters than is shown in FIG. 6. Alternatively, delay cell 600 can be implemented with RC delays, capacitively loaded inverters, current starved inverters, current controlled current starved inverters, or other delay techniques known in the art. For example, in embodiments of the present invention using programmable integrated circuits manufactured by Xilinx, Inc., for example, the Virtex-4 FPGA, the delay blocks can be implemented using an Input/Output Delay element IODELAY or delay element ODELAY available for use on the Virtex-4. On the Virtex-4, FPGA interconnect can be used to connect delay block to a programmable I/O block ODELAY and IODELAY, for example, can be programmed to delay a signal in up to 64 increments of about 75 ps each. In other embodiments of the present invention, delay blocks can be partitioned within the programmable or configurable I/O block. In further embodiments, the architecture of the programmable or configurable I/O block can be configured to programmably couple the delay blocks to output transistors according to embodiments of the present invention, for example, the embodiment shown in FIG. 4.

According to embodiments of the present invention, a target device, such as a PLD or an FPGA, undergoes a configuration process. First, a configuration data stream corresponding to an embodiment output driver is generated. This configuration data stream can be generated by a computer running commercially available CAD tools or vendor provided software. Next, a target FPGA is programmed by loading the configuration data stream into internal configuration memory cells that define how the programmable elements are configured within the FPGA. The configuration data can be read from memory (e.g., from an external PROM) or written into the FPGA by an external device. The collective states of the individual memory cells then configure the function of the FPGA according to embodiments of the present invention. In embodiments, it is the I/O cells that contain the circuitry that is configured to implement and embodiment output driver. However, in alternative embodiments of the present invention, a target FPGA can be configured to use cells from other configurable blocks besides I/O cells.

In one embodiment, a programmable logic circuit is configured to provide an output controller, a first transistor and a second transistor. The output controller configured to assert a first control signal when an input to the output controller is de-asserted, and assert a second control signal after the first control signal is de-asserted, so that the second control signal is activated for a first fixed duration. The first transistor is configured to have an output coupled to an output node of the logic circuit, and a first control terminal coupled to a first output of the output controller. The first transistor is configured to assert a reference voltage on the output node. The second transistor is configured to have an output coupled to the output node of the logic circuit, and a first control terminal coupled to a second output of the output controller. In this embodiment, the second transistor is configured to assert a first supply voltage on the output node. In embodiments of the present invention, the first transistor is implemented using a pull-up transistor, for example an NMOS or an NPN bipolar device, and the second transistor is implemented as a pull-up device, for example a PMOS or a PNP bipolar device. Alternatively, the first transistor can be implemented as a pull-up device and the second transistor can be implemented as a pull-down device.

In alternative embodiments of the present invention, other circuits and devices, such as a PLD or CPLD, can be used as target device. Like an FPGA, configuration data corresponding to an embodiment configuration may be generated using a computer running commercially available CAD tools or vendor provided software. The configuration data may be stored on the PLD or CPLD itself in volatile or non-volatile memory. Again, circuit components residing in an I/O section of the PLD or CPLD may be used to implement output drivers, however, other logic resources within the PLD or CPLD can be used as well. For example, other CPLD resources may be necessary to implement the necessary delay and pulse generation functions in some embodiments.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. An output driver for driving a bus line coupled to an external resistor biased at a first voltage comprising:
   a first driving device comprising a first terminal, the first terminal coupled to a first node of the bus line, wherein the first driving device is configured to couple the bus line to a reference voltage when activated by a first control signal;
   an internal resistor comprising a first terminal coupled to the first terminal of the first driving device, and a second terminal coupled to a second voltage, wherein the first and second voltages are not equal and a potential difference between the first and second voltages is less than a potential difference between the second voltage and the reference voltage;
a second driving device comprising a first terminal, the first terminal coupled to the first node of the bus line, wherein the second driving device is configured to couple the bus line to the second voltage when the second driving device is activated by a second control signal; and
a controller configured to activate the second control signal a first fixed period of time after the first control signal is deactivated and deactivate the second control signal a second fixed period of time after expiration of the first fixed period of time and prior to a subsequent activation of the first control signal.

2. The output driver of claim 1, wherein the first control signal transitions responsive to each transition of a data signal received by the controller, and
wherein the second control signal transitions high to low and low to high responsive only to low to high transitions of the data signal.

3. The output driver of claim 1, wherein:
the second driving device comprises a PMOS transistor; and
the first driving device comprises an NMOS transistor.

4. The output driver of claim 1, wherein:
the first driving device comprises a pull-down transistor;
the second driving device comprises a pull-up transistor;
the internal resistor comprises a pull-up resistor; and
the external resistor comprises a pull-up resistor.

5. The output driver of claim 1, wherein the controller is further configured to output a fixed pulse-width signal as the second control signal.

6. An electronic device comprising:
a first driving device comprising a first terminal, the first terminal coupled to a bus line terminal, wherein the first driving device is configured to couple the bus line terminal to a first supply potential when activated by a first control signal;
a second driving device comprising a first terminal, the first terminal coupled to the bus line terminal, wherein the second driving device is configured to couple the bus line terminal to a second supply potential when the second driving device is activated by a second control signal; and
a controller configured to activate the second control signal a first fixed period of time after the first control signal is deactivated and deactivate the second control signal a second fixed period of time after expiration of the first fixed period of time and prior to a subsequent activation of the first control signal, wherein the controller is further configured to generate a fixed pulse-width signal as the second control signal.

7. The electronic device of claim 6, further comprising an internal resistor comprising a first terminal coupled to the first terminal of the first driving device, and a second terminal coupled to a third supply potential, wherein the first, second, and third supply potentials are not equal to one another.

8. The electronic device of claim 7, wherein a potential difference between the second supply potential and the third supply potential is less than a potential difference between the first supply potential and the second supply potential.

9. The electronic device of claim 6, wherein the first control signal transitions responsive to each transition of a data signal received by the controller, and
wherein the second control signal transitions high to low and low to high responsive only to low to high transitions of the data signal.

10. The electronic device of claim 6, wherein the first driving device, the second driving device and the controller are comprised of programmably configurable circuit blocks.

11. The electronic device of claim 6, wherein:
the first driving device comprises a first transistor, the first transistor comprising
a first node coupled to the first supply potential,
a control node coupled to the first control signal, and
a second node coupled to the first terminal of the first driving device;
the second driving device comprises a second transistor, the second transistor comprising
a first node coupled to the second supply potential,
a control node coupled to an output of the controller, and
a second node coupled to the first terminal of the second driving device;
the bus line terminal comprises an output pad; and
the controller comprises
a first delay element comprising an input coupled to the first control signal; and
a logic block comprising a first input coupled to the first control signal and a second input coupled to an output of the first delay element, wherein the logic block is configured to output the fixed pulse-width signal at the logic block output.

12. The electronic device of claim 11, wherein:
the first transistor comprises a NMOS device, wherein
the first node of the first transistor comprises a source of the NMOS device
the control node of the first transistor comprises a gate of the NMOS device,
the second node of the first transistor node comprises a drain of the NMOS device, and
the first supply potential comprises ground potential; and
the second transistor comprises a PMOS device, wherein
the first node of the second transistor comprises a source of the PMOS device
the control node of the second transistor comprises a gate of the PMOS device,
the second node of the second transistor comprises a drain of the PMOS device, and
the second supply potential comprises a power supply voltage.

13. The electronic device of claim 11, wherein the first transistor comprises a Bipolar device, wherein
the first node of the first transistor comprises an emitter of the Bipolar device
the control node of the first transistor comprises a base of the Bipolar device,
the second node of the first transistor node comprises a collector of the Bipolar device, and
the first supply potential comprises ground potential.

14. The electronic device of claim 11, wherein the controller further comprises a second delay element coupled between the first control signal and the input of first delay element.

15. The electronic device of claim 11, wherein the first delay element comprises a programmable delay element.

16. The electronic device of claim 11, further comprising a resistor, the resistor comprising a first terminal coupled to the output pad and a second terminal coupled to a further supply potential.

17. The electronic device of claim 11, wherein the electronic device is part of a system, the system further comprising a bus line coupled to the output pad.

18. A method of operating an output buffer, the method comprising:
- activating a gate of a first transistor comprising a drain coupled to a signal bus and a source coupled to a reference voltage;
- deactivating the gate of the first transistor; and
- after deactivating the gate of the first transistor, activating a gate of a second transistor, wherein
  - the second transistor comprises a drain coupled to the signal bus and a source coupled to a supply voltage, and
  - activating the second transistor comprises activating the gate of the second transistor a first fixed period of time after the deactivating the gate of the first transistor, wherein the gate of the second transistor is deactivated a second fixed period of time after expiration of the first fixed period of time and prior to a subsequent activation of the gate of the first transistor.

19. The method of claim 18, further comprising:
- controlling the gate of the first transistor and the gate of the second transistor responsive to a controller receiving a data signal,
- wherein the gate of the first transistor activates or deactivates responsive to each transition of the data signal, and
- wherein the gate of the second transistor activates and deactivates responsive only to each low to high transition of the data signal.

* * * * *